United States Patent [19]
Nelson

[11] Patent Number: 5,672,464
[45] Date of Patent: Sep. 30, 1997

[54] METHOD AND APPARATUS FOR PATTERNING AN IMAGING MEMBER

[75] Inventor: William E. Nelson, Dallas, Tex.

[73] Assignee: Texas Instruments Incorporated, Dallas, Tex.

[21] Appl. No.: 478,159

[22] Filed: Jun. 7, 1995

Related U.S. Application Data

[62] Division of Ser. No. 242,926, May 16, 1994, Pat. No. 5,482,818, which is a division of Ser. No. 47,254, Apr. 14, 1993, Pat. No. 5,330,878, which is a continuation of Ser. No. 742,133, Aug. 8, 1991, abandoned.

[51] Int. Cl.⁶ .................................................. G03F 7/20
[52] U.S. Cl. .......................... 430/327; 430/311; 347/248; 347/255
[58] Field of Search .................... 430/311, 30, 327; 347/248, 255

[56] References Cited

U.S. PATENT DOCUMENTS

| | | | |
|---|---|---|---|
| 3,985,439 | 10/1976 | Kiemle | 355/46 |
| 4,436,806 | 3/1984 | Rendulic et al. | 430/311 |
| 4,577,932 | 3/1986 | Gelbart | 350/358 |
| 4,638,309 | 1/1987 | Ott | 340/752 |
| 4,778,747 | 10/1988 | Ohta et al. | 430/321 |
| 5,151,718 | 9/1992 | Nelson | 346/160 |
| 5,530,878 | 6/1996 | Nelson | 430/311 |

*Primary Examiner*—Kathleen Duda
*Attorney, Agent, or Firm*—Julie L. Reed; James C. Kesterson; Richard L. Donaldson

[57] ABSTRACT

A device for patterning an imaging member (46) is provided. The device comprises a light source (24) which emits light rays (26). Light rays (26) pass through a collimator lens (28) to collimate the light rays (30). The light then strikes a spatial light modulator (32) which is controlled by a computer (40) to reflect the light (42). The light passes through an imaging lens (44) to magnify the pattern for striking imaging member (46). Imaging member (46) is thus patterned by changing modulator (32) by computer (40).

5 Claims, 2 Drawing Sheets

METHOD AND APPARATUS FOR PATTERNING AN IMAGING MEMBER

RELATED APPLICATIONS

This is a divisional of application Ser. No. 08/242,926, filed May 16, 1994, now U.S. Pat. No. 5,482,818, which is a Division of application Ser. No. 08/047,254, filed Apr. 14, 1993 (now U.S. Pat. No. 5,330,878), which was a continuation of application Ser. No. 07/742,133, as originally filed on Aug. 8, 1991, abandoned.

This case is related to "Method and Apparatus for Patterning an Imaging Member", U.S. Ser. No. 453,022, which has been continued to U.S. Ser. No. 730,511.

TECHNICAL FIELD OF THE INVENTION

This invention relates in general to techniques for forming integrated circuits or printed circuit boards, and in particular to a method and apparatus for patterning a printed circuit board or an imaging member using a spatial light modulator.

BACKGROUND OF THE INVENTION

In one standard process for manufacturing printed circuit boards (PCBs), a master reticle is generated by a computerized system that exposes a one-to-one image of the desired PCB pattern on a film or other substrate. Subsequently, masks are created for contact printing of metallized PCB substrates that have a photoresist coating. When the resist is developed, the metal is etched to reveal the original interconnect pattern of the master reticle. The board will then be laminated together with the other boards representing the different levels of a finished PCB. Then the finished PCB is tested. If a design flaw, as opposed to a process flaw, is found, the entire process must be redone.

Creation of the master reticle is expensive. After the master reticle is completed, it must be transferred to a working film, which is also costly. With many flaws, this can become extremely expensive, not to mention time consuming. There is a need for a method of manufacturing PCBs that does not involve repetitive manufacture of master reticles, or periodic replacement of working reticles.

SUMMARY OF THE INVENTION

The present invention disclosed herein comprises a method and apparatus for patterning an imaging member which substantially eliminates or reduces steps associated with prior patterning methods and devices. The present invention allows the patterning of an imaging member without the time consuming creation of an expensive set of reticles.

An embodiment of the invention would be in the printed circuit board (PCB) manufacturing process. A linear or area array device could be utilized, depending on the scale, or process speed requirement of the system. In this embodiment, a line of data introduced serially to the device would be moved in parallel through the area array one line at a time, while maintaining synchronization with the area to be exposed on the imaging member. The result is a greatly reduced exposure time for the photolithography process, compared to the use of a linear array, and a similar improvement in process speed for the PCB generation. The pattern to be imaged is fed to a spatial light modulator, which images the pattern directly onto a resist coated PCB, eliminating the need for reticles and working films.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
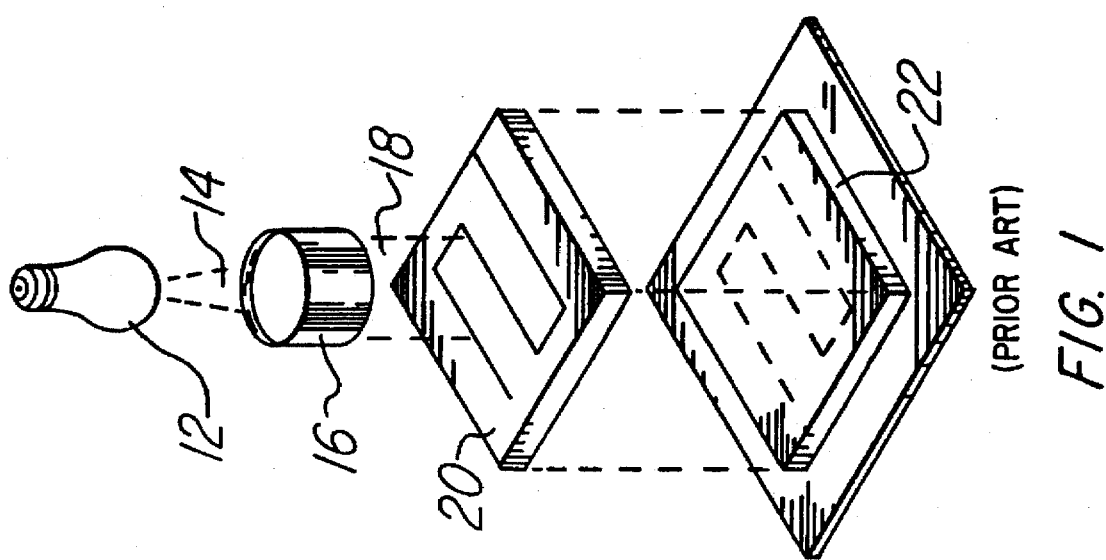
FIG. 1 is a perspective view of a prior art system for patterning a PCB.

In FIG. 1, a prior art system for making a PCB working film is shown. Not shown in this system is the layout done on a workstation to create the necessary data for the generation of the original pattern nor the step of creating the reticle.

Reticle 20 is made by a 1-to-1 exposure of the image generated in the work station. It is then positioned under a light source 12, which is focused on the reticle by lens 16. The pattern on the reticle 20 is then passed via a Diazo process to a piece of working film 22. The film is then exposed onto a copper clad blank PCB that is coated with resist. The pattern on the board is developed, and the board is etched.

To make the well-known layered boards that have several different levels of circuitry, the above process is done separately for each level. After the boards are all completed, they are laminated together into one board. Then the board is tested to ensure the proper circuitry is on the board.

If there is a problem with a board that requires it to be altered and manufactured, the entire process must be repeated. Obviously, this is an expensive and time consuming process.

Figure 2:
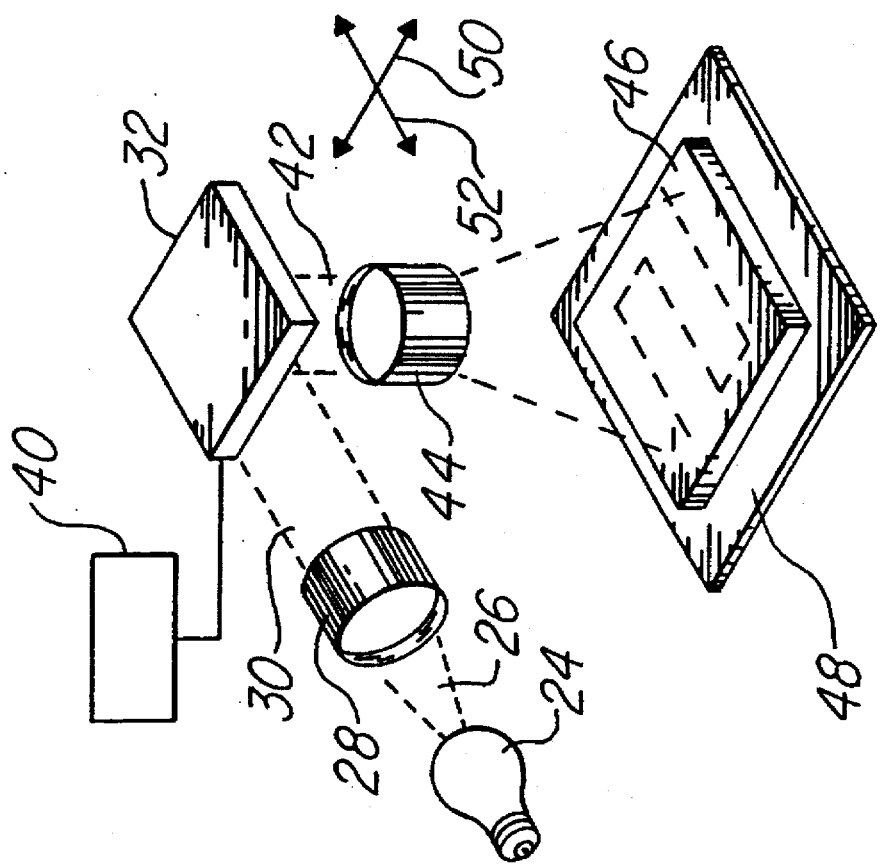
FIG. 2 is a perspective view of an apparatus for patterning a PCB in accordance with the present invention.

The present embodiment of the current invention is shown in FIG. 2. The layout data is entered into computer 40. Light source 24, which as an example may be ultraviolet, produces rays 26 which are collected by lens 28, directed onto a spatial light modulator 32 and generally brought to focus at the aperture of imaging lens 44. The spatial light modulator by selectively addressing pixel elements, causes individual portions of the illuminating beam 30 to be reflected into the lens 44 along path 42. The spatial light modulator, in this embodiment, comprises individually controlled elements, such as deformable mirror devices, as an example, or liquid crystals may be used in embodiments using light at other frequencies.

The selection of the individual elements of the array to reflect light is completed by the computer 40 using the layout dam. The computer causes the array to form an image of the desired circuitry upon the member 46, which is a board coated with resist, or a reticle substrate. In the former case, this accomplishes the same steps as discussed above, but eliminates the need for a master reticle and the working film. The computer data file of the desired layout basically replaces the master reticle as the source of the desired image. In the latter case, it is possible to pattern reticle substrates in this manner also, for manufacturers whose equipment requires the use of reticles.

The member 46 rests upon a movable stage 48 or moving platform that can be shifted in the x direction shown by arrow 50, and, independently in the y direction shown by arrow 52. This allows the member to be aligned and passed under the array to image the member correctly. The member is imaged in a mosaic fashion, as opposed to a linearly scanned fashion, as is typically used with a laser scanner. The member is repeatedly stepped by the computer controlled x-y stage, exposing one block of the mosaic at a time, to the light from the spatial light modulator.

The board then undergoes the same processes as discussed above. Ira problem is found in the finished board, rather than redesigning the layout, manufacturing a new master reticle and a new working film, all that is required is to correct the design file and rerun the PCB. The new board can be made directly from the corrected layout data, as it is used to control the spatial light modulator.

Figure 3:
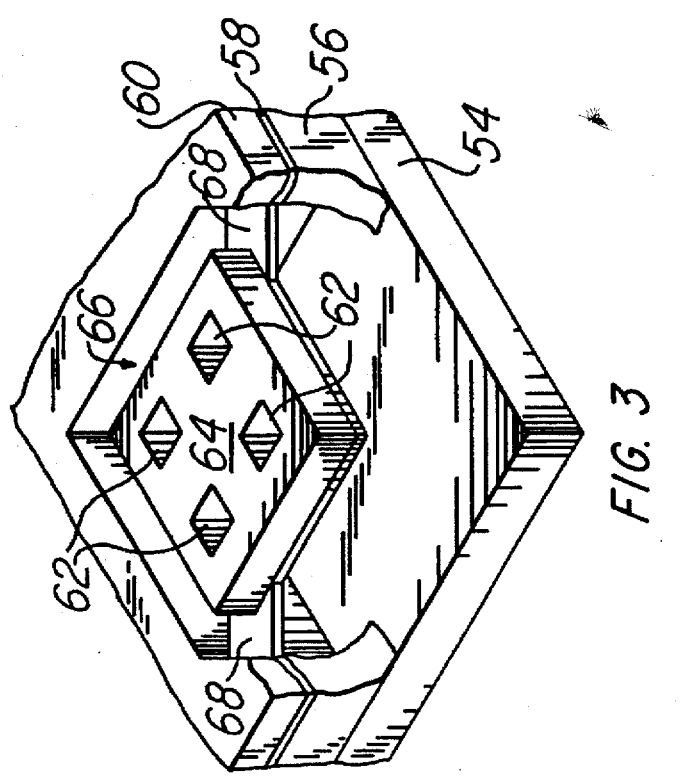
FIG. 3 is a prior art cut away view of a deformable mirror device.

The spatial light modulator could be one of many types. In this embodiment of the present invention, a deformable mirror device (DMD) is used. A perspective view of one mirror element is shown in FIG. 3. The DMD is typically manufactured monolithically in silicon as a linear or an area array, but only one element is shown here. A substrate 54 is covered with metal and patterned to form the address electrodes, not shown. A spacer layer 56 is then coated on the electrode layer. A layer of thin reflective metal is then deposited on top of the spacer, followed by a thick layer of the same or similar metal 60. To define the mirror element 64, the thick layer 60 is patterned and etched to leave the thick metal everywhere but in the gaps 66 and over hinges 68. Holes 62 are left in the thick layer to allow undercutting of the spacer layer 56. The resultant structure comprises mirror element 64 suspended over the air gap on hinges 68. When the electrode to either side of the hinge centerline of the mirror on substrate 54 is addressed, the torque rotates the mirror about the hinge, causing the light being directed onto the mirror to be deflected along a different optical path. This architecture is known as the bistable torsion beam DMD. Other configurations of the DMD could be used, including linear and area arrays, and pixel elements of differing sizes and geometric configurations. Combinations of DMDs could be used as well, to speed the process, or simply the step-and-repeat patterns.

Figure 5:
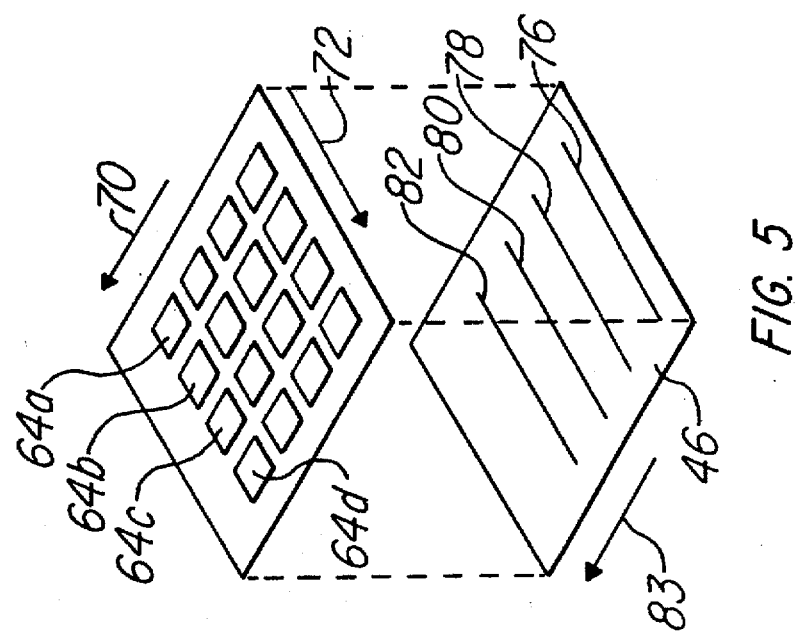
FIG. 5 shows the movement of the data and the board relative to each other.
Figure 4:
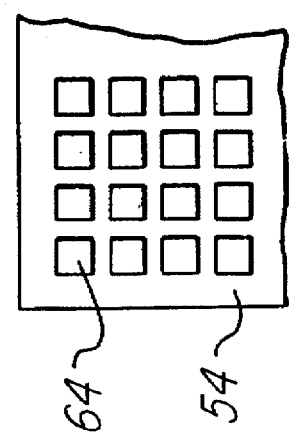
FIG. 4 is a plan view of a deformable mirror device array.

FIG. 4 shows an area array of the DMD devices. The substrate 54 shows many reproductions of the mirror element, or cell, 64. The data can be loaded in any number of ways to coincide with the desired pattern to be projected upon the imaging member. One of those ways is shown by the arrows 70 and 72 in FIG. 5.

The data is loaded serially into a row of cells, conceptually shown by arrow 70. The line of cells containing mirror 64a corresponds to the line of image data 76 on the member 46 in its initial starting place. As the data is passed in parallel down the array in the direction of arrow 72 to the row of cells with 64b, the member moves in synchronization with the line of data. The line of data 76 moves with the member along direction to what had been position 78. Similarly, as the data moves to the row of mirrors with 64c, the board would move to force the line of data to be at what had been position 80. The given line of information would expose the same area on the board for as many lines as the area array contains. By this method, a flow of the old data across the face of the chip is mirrored at the board at a constant location. The result is a greatly improved exposure time for the photolithography process, and a similar improvement in process speed.

The number of lines available in the spatial light modulator array could exceed the number of sequential exposures required to fully expose the photoresist layer on the PCB or the reticle substrate. The option then exists to terminate the parallel flow of a particular line of data across the spatial light modulator array and reduce the total light energy level impinging on the PCB or reticle. By controlling the total number of exposure lines actually utilized, the exposure process can be tailored to accommodate process equipment and photoresist chemistry variables.

What is claimed is:

1. A method of processing data comprising:
   a. loading a line of data into a first row of modulator elements of a two-dimensional array of spatial light modulator elements;
   b. impinging a light beam on said two-dimensional array of spatial light modulator elements wherein said two-dimensional array of spatial light modulator elements selectively modulates at least a portion of said light beam in response to said line of data loaded into said two-dimensional array of spatial light elements;
   c. passing said line of data in parallel through said two-dimensional array of spatial light modulator elements to an adjacent row of modulator elements in said two-dimensional array of spatial light modulator elements;
   d. moving an imaging member past said two-dimensional array of spatial light modulator elements such that said portion of said modulated light beam impinges upon said imaging member; and
   e. synchronizing said passing of said line of data with said moving of said imaging member to cause said portion of said modulated light beam to impinge on a fixed area of said imaging member for an extended period of time.

2. The method of claim 1 wherein said loading step is done serially.

3. The method of claim 1 wherein said moving step comprises moving said imaging member underneath said two-dimensional array of spatial light modulator elements.

4. The method of claim 1 wherein said two-dimensional array of spatial light modulator elements comprises an area array of deformable mirror devices.

5. The method of claim 1 wherein said passing of a given line of data in parallel through said two-dimensional array of spatial light modulator elements is terminated prior to passing said line of data through every row of said two-dimensional array of spatial light modulator elements, thereby reducing the total light energy from said portion of said modulated light beam impinging on said fixed area of said imaging member.

\* \* \* \* \*